United States Patent [19]

Muterspaugh

[11] 4,418,427
[45] Nov. 29, 1983

[54] TUNING SYSTEM FOR A MULTI-BAND TELEVISION RECEIVER

[75] Inventor: Max W. Muterspaugh, Indianapolis, Ind.

[73] Assignee: RCA Corporation, New York, N.Y.

[21] Appl. No.: 363,567

[22] Filed: Mar. 30, 1982

[51] Int. Cl.³ .............................................. H04B 1/16
[52] U.S. Cl. .................................. 455/180; 455/188; 455/191; 455/340
[58] Field of Search ................ 455/168, 180, 188–191, 455/340; 358/191.1

[56] References Cited

U.S. PATENT DOCUMENTS

| | | | |
|---|---|---|---|
| 3,492,514 | 1/1970 | Korn | 307/320 |
| 3,622,891 | 11/1971 | Leland . | |
| 3,646,450 | 2/1972 | Ma . | |
| 3,652,960 | 3/1972 | Sakamoto et al. . | |
| 3,696,302 | 10/1972 | Gossard . | |
| 3,980,957 | 9/1976 | Pützer . | |
| 3,987,400 | 10/1976 | Fathaver | 455/180 |
| 4,048,598 | 9/1977 | Knight | 334/15 |
| 4,189,678 | 2/1980 | Sakamoto et al. . | |
| 4,247,953 | 1/1981 | Shinagawa et al. | 455/191 |
| 4,262,307 | 4/1981 | Brun et al. | 358/195.1 |
| 4,271,529 | 6/1981 | Strammello, Jr. | 455/180 |
| 4,303,944 | 12/1981 | Kitamura | 358/191.1 |
| 4,361,909 | 11/1982 | Theriault | 455/286 |
| 4,363,135 | 12/1982 | Moon | 455/180 |
| 4,368,541 | 1/1983 | Evans | 455/186 |

FOREIGN PATENT DOCUMENTS 1584738 2/1981 United Kingdom .

*Primary Examiner*—Jin F. Ng
*Attorney, Agent, or Firm*—E. M. Whitacre; P. J. Rasmussen; C. A. Berard, Jr.

[57] ABSTRACT

A television tuning system includes UHF and VHF signal paths each tuned by a tuning voltage and coupled to a common signal path by a diplexer. So that UHF signals will be attenuated so to not cause interference with a VHF channel signal which is selected to be viewed, the UHF filter is detuned when a VHF channel is selected. Detuning the UHF filter is accomplished by modifying the tuning voltage for the UHF filter responsive to the VHF band-switching voltage.

7 Claims, 3 Drawing Figures

TUNING SYSTEM FOR A MULTI-BAND TELEVISION RECEIVER

This invention relates to tuning systems for television receivers and, in particular, to those in which a double-tuned signal path is de-tuned for certain conditions.

Television (TV) tuning systems select desired ones of many TV radio frequency (RF) signals at different frequencies received from broadcast or cable TV signal sources in order to produce an intermediate frequency (IF) signal from which display and sound information is derived. In a double-conversion tuning system, two frequency conversions (shifts) are performed to translate the received RF signal first to a first IF signal and then to a second and final IF signal.

It is not uncommon for signals of different channels to interfere with each other causing degradation of the TV picture and/or sound ultimately reproduced. The degree to which such interference is generated depends upon the frequency selective characteristics of filters, the operation of the mixer and local oscillator, and the selection of the intermediate frequency ranges.

Consider, for example, the selection of VHF channel 5 which has an RF picture carrier at 77.25 MHz by a double-conversion tuning system having a first IF passband surrounding a first picture carrier frequency of 415.75 MHz. A local oscillator frequency of 493 MHz is developed so that a first mixer converts the 77.25 MHz RF picture carrier to the 415.75 MHz. If a signal at UHF channel 31 having an RF picture carrier at 573.25 MHz also becomes mixed with the local oscillator signal, a signal at the difference frequency 80.25 MHz may be produced. Since 80.25 MHz is within the frequency band of VHF channel 5, (i.e., 76 to 82 MHz), an interference condition may be produced. In similar fashion, there exist UHF RF carriers which can produce interference conditions for each of the low-band VHF channels 2 through 13, as well as many of the cable TV channels.

Conventionally, the generation of interfering signals can be inhibited by placing switches, such as PIN diodes or transistor switches, in the signal path between the source of RF signals and the mixer to thereby prevent potentially interfering signals in a non-selected band from reaching the mixer. At UHF frequencies, however, signal "leakages" through or around such switches when they are supposed to be non-conductive, such as by "stray" capacitances, can be of sufficient strength to cause undesirable interference. The present invention provides substantial attenuation of unwanted signals to ensure that any interference developed will be insubstantial and therefore not discernible in the TV picture or sound.

To that end, the tuning system of the present invention comprises first and second signal paths corresponding to first and second tuning bands and having frequency selective characteristics controlled in response to a tuning signal developed by a tuning control device. Signals from the first and second signal paths are combined onto a common signal path. The tuning control device also develops a band-indicative signal for modifying the tuning signal applied to first and second resonant circuits in the first signal path by different amounts when a channel in the second band is selected.

In the double conversion tuning system of FIG. 1, television signals received at UHF antenna input 10, at VHF antenna input 30A and at CATV input 30B are coupled to diplexer 20 as will be described below. In the United States, those television signals comprise the channel numbers and reside in the frequency bands indicated in the following table.

TABLE 1

| TV Band | Frequency Range (megaHertz) | Channel Designations |
| --- | --- | --- |
| Low VHF Broadcast (L-VHF) | 54 to 88 | 2 to 6 |
| Midband Cable (MB-CATV) | 90 to 174 | A-5 to I |
| High VHF Broadcast (H-VHF) | 174 to 216 | 7 to 13 |
| Superband Cable (SB-CATV) | 216 to 402 | J to W + 17 |
| UHF Broadcast (UHF) | 470 to 890 | 14 to 83 |

Each channel is alloted about 6 MHz of bandwidth in the frequency spectrum and has a picture carrier at a frequency 1.25 MHz higher than the frequency at the lower limit of its assigned channel bandwidth. Where specific frequencies are referred to in the following descriptions, that frequency will correspond to the frequency of the picture carrier (PIX) of the selected television channel.

Figure 2:
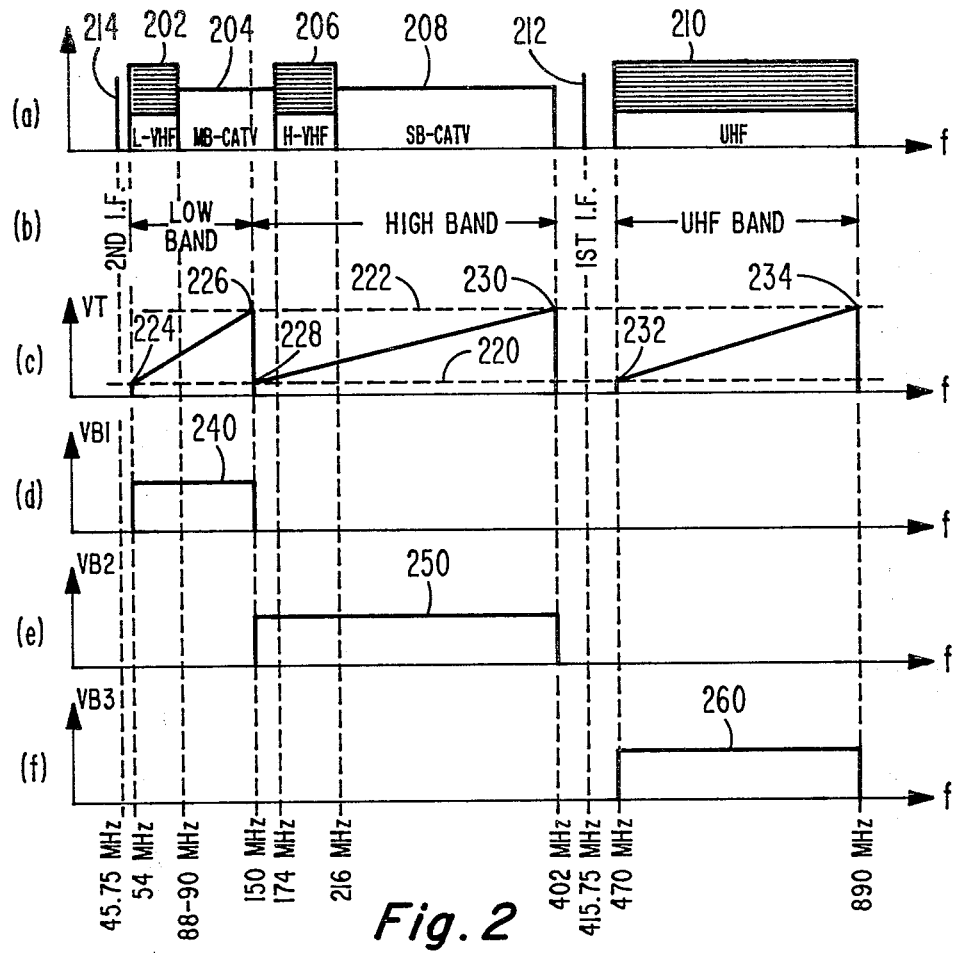
FIG. 2 shows graphical representations of various amplitude versus frequency characteristics associated with the embodiment of FIG. 1.

The frequency spectrum for channel frequencies "f" in the various TV frequency bands in the United States is shown in FIG. 2(a). For the L-VHF band 202, H-VHF band 206 and UHF band 210, the amplitude of received signals is shown as a plurality of levels indicating that broadcast signals can vary in strength over a wide range, for example, between 10 microvolts and 100 millivolts. Received CATV signals, on the other hand, exhibit a much smaller variation in signal strength, typically between 1 and 6 millivolts, as illustrated for the MB-CATV band 204 and the SB-CATV band 208.

FIG. 2(b) defines the low-band, high-band and UHF-band of radio frequencies (RF) associated with filters 44, 36 and 14, respectively, of FIG. 1 to be described below. The picture carrier of the first intermediate frequency (IF) signal is selected to be at 415.75 MHz, which is between the SB-CATV and the UHF-TV bands. The picture carrier of the second IF signal is at the standard frequency of 45.75 MHz used in the United States. The bandwidth of the desired TV signal at each IF frequency is approximately 6 MHz and is centered on about 414 MHz for the first IF and 44 MHz for the second IF.

It is understood that while the present invention is described in terms of the various broadcast and cable bands presently used in the United States, the invention is not limited to that arrangement. For example, off-the-air broadcast band signals could in fact be supplied from a cable TV signal source and, in addition, be in TV frequency bands employed elsewhere, such as Europe or Japan.

Figure 1:
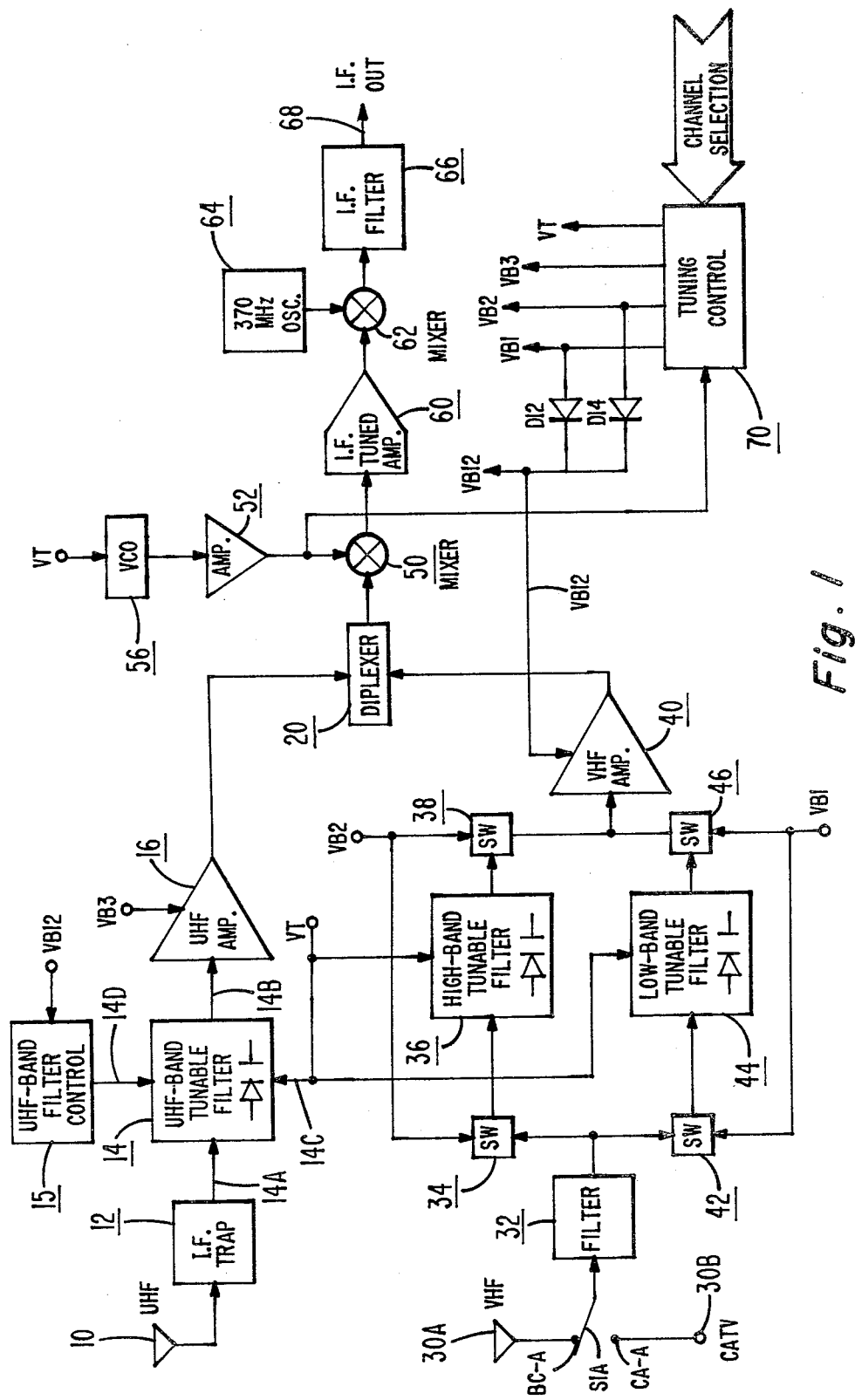
FIG. 1 is a schematic diagram in block diagram form of a tuning system including an embodiment of the present invention.

As shown in FIG. 1, when the TV channel selected is within the UHF band, it is coupled from UHF antenna 10 to a first input terminal of diplexer 20 via the UHF-band frequency selective tunable filter 14. Filter 14 receives tuning potential VT at connection 14C so that it is tuned to preferentially pass between its input 14A and its output 14B signals at the frequencies corresponding to that of the selected TV channel.

UHF filter 14 exhibits a tunable low-pass frequency selective characteristic in response to tuning voltage VT. It exhibits attenuation of signals having frequencies below that of the selected channel and exhibiting relatively greater attenuation at frequencies higher than that of the selected channel. Filter 14 exhibits a peak amplitude response at about the frequency of the selected channel (i.e. a peak passband having minimum attenuation). The bandwidth of that peak is about 25 MHz when tuning near UHF channel 14 and increases somewhat to about 40 MHz when tuning near UHF channel 83, for the specific embodiment of filter 14 described below with respect to FIG. 3.

IF Trap 12 reduces the level of any signals at frequencies close to the first IF received by UHF antenna 10. This is desirable because the 415.75 MHz first IF frequency is near the low end of the UHF band. Those undesirable signals could either be externally developed, e.g. radio or radar signals, or could be radiated or conducted from the first IF section. Trap 12 suppresses unwanted signals near the first IF frequency which might otherwise be applied to the IF circuits. For this purpose, trap 12 attenuates signals between 411 and 417 MHz.

UHF amplifier 16 couples signals between output 14B of filter 14 and a first input of diplexer 20. Amplifier 16 exhibits about 14–15 dB of gain over the UHF frequency range and has input and output impedances of about 50 ohms to match the impedances of filter 14 and diplexer 20. Amplifier 16 is operative only when a channel in the UHF band has been selected because its operating voltage, bandswitch voltage VB3 (about 18 volts), is present only when channels in the UHF frequency band have been selected, as indicated by level 260 of FIG. 2(f). Because amplifier 16 is not powered when signals in other than the UHF band are selected to be received, it provides attenuation in the path between antenna 10 and diplexer 20 at such times.

TV signals in the VHF and CATV bands (54 to 402 MHz) are partitioned into low and high tuning bands because they span more than a seven-to-one range of frequencies. Tuning over a range greater than three-to-one is impractical owing to the limited range of voltage-variable capacitance diodes. Accordingly, the tuning apparatus of FIG. 1 for the VHF and CATV bands is partitioned to tune in low and high tuning bands separated at a frequency within the MB-CATV band, i.e. about 150 MHz, as shown in FIG. 2(b). As a result each of the high and low tuning bands includes signals having less than a three-to-one range of frequencies.

TV signals in the VHF and CATV frequency bands are coupled to diplexer 20 in FIG. 1 as follows. Switch S1A can be switched to position BC-A to apply signals from VHF antenna 30A to the input of filter 32 or can be connected to position CA-A to apply CATV signals from input terminal 30B to filter 32. Filter 32 is a high-pass filter which attenuates signals at frequencies below about 40 MHz which is slightly less than the lowest frequency to be received (i.e., VHF channel 2 at 54 to 60 MHz). Filter 32 passes signals in both the low (54 to 150 MHz) and high (150 to 402 MHz) bands. If the selected channel is in the high-band, then VB2 is applied to switches 34 and 38 to render them conductive (closed) to thereby couple high-band filter 36 between filter 32 and VHF amplifier 40. If the selected channel is in the low-band, however, then VB1 is applied to switches 42 and 46 to render them conductive to connect low-band filter 44 between filter 32 and VHF amplifier 40.

High-band tunable filter 36 exhibits a tunable high-pass frequency selective characteristic in response to tuning voltage VT. It exhibits greater attenuation of signals having frequencies below that of the selected high-band channel then of signals having frequencies above that of the selected channel. Minimum attenuation is exhibited in a peak passband which includes the frequency of the selected channel. As a result, filter 36 not only selects the RF carrier for the selected channel but also tends to reject signals at lower frequencies, particularly those signals in the low band.

Low-band tunable filter 44 exhibits a tunable low-pass frequency selective characteristic in response to VT similar to that described above in relation to UHF filter 14 except that the bandwidth of its peak amplitude response passband is allowed to increase to a substantially greater degree as higher frequency channels are selected. Filter 44 not only selects the RF carrier of the selected channel but also tends to reject signals at higher frequencies, particularly those signals in the high band and at the first IF frequency.

VHF amplifier 40 in FIG. 1 couples signals from filter 36 or 40 to a second input of diplexer 20. Operating potential VB12 is applied to VHF amplifier 40 whenever a channel within the low or high tuning bands is selected, but VB12 is not applied when a channel in the UHF band is selected. The VHF and CATV signal paths are thus disconnected from diplexer 20 when a UHF channel is selected. Operating potential VB12 is developed from bandswitch voltages VB1 and VB2 by a diode "OR" circuit including diodes D12 and D14.

Diplexer 20 of FIG. 1 receives RF signals from the UHF band signal path at a first input connection and receives RF signals from the VHF and CATV band signal paths at a second input connection and couples the received RF signals to a common signal path at its output connection. Diplexer 20 can satisfactorily be a passive-element signal combiner.

Mixer 50 receives RF signals from the output of diplexer 20 and local oscillator frequency signals from amplifier 52 and translates the RF signals to an IF signal having a picture carrier at the first IF frequency of 415.75 MHz.

A tunable voltage controlled local oscillator arrangement (VCO) 56 develops the local oscillator frequency signal for each of the three tuning bands. The VCO frequency is responsive to tuning voltage VT so as to track the tuning of the appropriate one of band filters 14, 36 and 44. The range of VCO frequencies are indicated in the following table.

TABLE 2

| Band | Channel Number | Local Oscillator Frequency (MHz) |
|---|---|---|
| Low-Band | 2 to 6 (L-VHF) | 471 to 499 |
|  | A-5 to E (MB-CATV) | 507 to 561 |
| High-Band | F to I (MB-CATV) | 567 to 585 |
|  | 7 to 13 (H-VHF) | 591 to 627 |
|  | J to W + 17 (SB-CATV) | 633 to 813 |
| UHF-Band | 14 to 83 (UHF) | 887 to 1301 |

Amplifier 52 amplifies the signal from VCO 56 so that the RF signals from diplexer 20 can also be of greater relative strength without introducing additional distortion in mixer 50.

The first IF signal from mixer 50 is then amplified by tuned IF amplifier 60. Amplifier 60 includes a two-section input filter tuned to the 415.75 MHz first IF picture carrier frequency and having about 12 MHz bandwidth, and a three-section output filter also tuned to 415.75 MHz and having about 10 MHz bandwidth. The centers of the pass bands of these filters is, in fact, at about 414 MHz. The amplified IF signal from amplifier 60 is then mixed with a 370 MHz frequency signal from second local oscillator 64 by mixer 62 to produce the second IF signal having a picture carrier at 45.75 MHz. The second IF signal is coupled to IF output 68 via IF filter 66.

Tuning control 70 responds to selection of a channel to develop tuning potential VT and bandswitch potentials VB1, VB2 and VB3. Tuning potential VT, shown in FIG. 2(c), typically varies between a low level of about 1.5 volts, indicated by phantom line 220, and a higher level of about 24 volts, indicated by phantom line 222. When the selected channel is in the low tuning band, VT tends toward a low value at point 224 when VHF channel 2 is selected and tends toward a high value at point 226 when MB-CATV channel E is selected. When the selected channel is in the high tuning band, VT tends toward a low value at point 228 when MB-CATV channel F is selected and tends toward a high value at point 230 when SB-CATV channel W+17 is selected. Similarly, VT tends toward a low value at point 232 when UHF channel 14 is selected and toward a high value at point 234 when UHF channel 83 is selected.

Bandswitch signals VB1, VB2 and VB3 are at a high level of about 18 volts as indicated by characteristics 240, 250 and 260 of FIGS. 2(d), 2(e) and 2(f) only when a channel in the band to which they correspond has been selected, and are at zero volts when a channel outside that particular band is selected. U.S. Patent Application Ser. No. 271,742, entitled A PHASE-LOCKED LOOP TUNING SYSTEM INCLUDING A PRESCALER CONDITIONED TO OSCILLATE AT AN OUT-OF-BAND FREQUENCY, filed by D. J. Carlson et al. on June 5, 1981, now U.S. Pat. No. 4,368,540 issued Jan. 11, 1983 and assigned to the same assignee as is the present invention, is incorporated herein by reference for the purpose of describing a tuning control device suitable for developing tuning and bandswitch potentials of the sort developed by control 70.

UHF band filter control 15 receives band signal VB12 which is at a high level whenever the selected channel is in the high or low band. In that case, the selected low band RF signal is passed by one of band filters 36 and 44. UHF RF signals should not be coupled to diplexer 20 at such times and are attenuated by UHF amplifier 16 being in an unpowered condition since UHF band signal VB3 is at a low level. However, strong UHF RF signals can "leak" through around or through amplifier 16 owing to unavoidable parasitic capacitive coupling paths inherent in its physical arrangement. These undesired UHF RF signals can be mixed with the signal from VCO 56 in mixer 50 to become interfering signals at the IF frequency as previously described.

Such undesired UHF RF signals are not ordinarily (i.e. without filter control 15) attenuated by filter 14 which is tuned to track the tuning of band filters 36 and 44 because all three filters are tuned by the same tuning voltage VT. To reduce interfering signals to levels which are not discernible to the TV viewer, filter control 15 responds to band signal VB12 to modify the tuning voltage VT within band filter 14 via connection 14D. Filter 14 is thereby detuned so as to attenuate UHF signals passing through it to UHF amplifier 16. As is explained below, detuning of filter 14 is accomplished by causing each of its two tuned circuits to receive differently modified tuning voltages so as to be tuned to different frequencies which are substantially different from the frequency of the potentially interfering channel.

Figure 3:
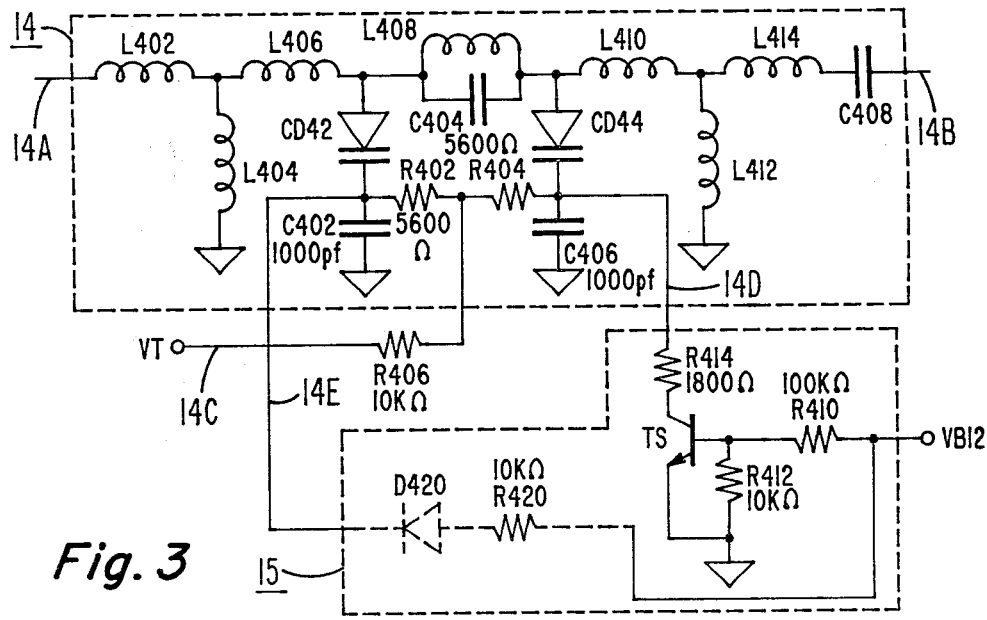
FIG. 3 is a schematic diagram of a circuit including an embodiment of the present invention useful in the tuning system of FIG. 1.

UHF-band filter 14, shown in FIG. 3, is a double-tuned, low-pass filter with "high-side inductive coupling" provided between its input 14A and its output 14B by the serial connection of inductors L402, L406, L408, L410 and L414. Capacitor C408 serves as a DC blocking capacitor with negligible AC impedance at UHF frequencies. Inductors L404 and L406 serve as a tapped inductor configuration for maintaining the impedance at input 14A at about 50 ohms. Similarly, inductors L410 and L412 serve as a tapped inductor configuration for maintaining the impedance at output 14B at about 50 ohms. Input and output inductors L402 and L414 aid in maintaining a substantially constant bandwidth over the broad tuning range of filter 14. Capacitor C404, which may comprise capacitance associated with conductors on a printed-circuit board, is in parallel with inductor L408. C404 and L408 are selected to resonate at about 1,000 MHz. Variable frequency tuning is provided by variable capacitance (varactor) diodes CD42 and CD44 which are respectively connected from the ends of the L408-C404 tuned circuit to ground via coupling capacitors C402 and C406. C402 and C406 exhibit a very low impedance at the frequencies of the UHF television signals passed by filter 14. The anodes of CD42 and CD44 are d.c. coupled to ground potential through inductors L404, L406, L408, L410 and L412.

Tuning potential VT is applied at terminal 14C to vary the capacitance of diodes CD42 and CD44 through isolation resistors R402, R404 and R406. VT can vary between about 1.5 and 24 volts for UHF channels 14–83 as indicated in FIG. 2(c). Because negligible d.c. currents are conducted by capacitance diodes CD42 and CD44, there is substantially no d.c. voltage drop developed across any of R402, R404 and R406 so that essentially the full magnitude of tuning voltage VT is applied to the cathodes of CD42 and CD44.

Filter control circuit 15 modifies the voltages applied to both CD42 and CD44 to detune filter 14 when the selected channel is not in the UHF band as follows. Band indicating voltage VB12 is then at a high level of about +18 volts to apply forward bias to the base of switch transistor TS via resistors R410 and R412. TS is thereby rendered conductive to make a conductive connection between the cathode of CD44 and ground potential including the collector-emitter path of TS, connection 14D and resistor R414. As a result, resistors R406, R404 and R414 now serve as a voltage divider for VT between connection 14C and ground, thereby providing different modified tuning potentials at the respective cathodes of CD42 and CD44.

Because the voltage across each of CD42 and CD44 is reduced, each exhibits a larger capacitance thereby reducing the resonant frequencies of the respective circuits in which they are coupled. Since those voltages are reduced by different amounts, those respective resonant circuits will become tuned to different frequencies thereby making filter 14 serve as a broadband attenuator. If the voltages are changed by substantially the same amount, the peak response of the double-tuned circuit is merely shifted.

It is noted that the present invention eliminates sources of potential interference other than that previously described herein. For example, where VCO 56 also develops a component signal at the second harmonic of the desired local oscillator frequency for the selected VHF TV channel, a signal from an unselected UHF channel can be shifted into the first IF signal band by mixer 50 responding to the second harmonic signal. One such case is where VHF channel 4 is selected. The second harmonic (966 MHz) of the local oscillator 56 frequency (483 MHz) can shift a signal on UHF channel 27 (549.25 MHz PIX) to 416.75 MHz which is unacceptably close to the 415.75 MHz first IF signal frequency.

Modifications of the described embodiments are contemplated to be within the scope of the present invention which is limited only by the claims following. For example, VB12 can additionally be applied to CD42 via the series connection of resistor R420, diode D420 and connection 14E to increase the modified tuning voltage across CD42 thereby tuning the resonant frequency of the circuit in which it is included to a frequency higher than that associated with the value of VT. The two resonant circuits are therefore detuned in different senses owing to the modification of their respective tuning voltages in different senses. I.e. the CD42 portion is detuned to a higher frequency whereas the CD44 portion is detuned to a lower frequency. While this modification is advantageous in that it causes the widest separation in the frequencies to which the resonant circuits including CD42 and CD44 are tuned, it increases the complexity and cost of filter control circuit 15 beyond that which was found satisfactory to avoid objectionable interference.

What is claimed is:

1. A tuning system for a television receiver comprising:
   first and second signal paths for receiving radio frequency signals disposed in respective first and second frequency bands, each of said signal paths including filter means for providing frequency selective characteristics controllable in response to a tuning signal, said filter means of said first signal path including first and second resonant circuits responsive to said tuning signal;
   tuning control means for developing said tuning signal to select one of said radio frequency signals within said first and second frequency bands and for developing a band signal indicative of the one of said first and second frequency bands which includes said selected radio frequency signal;
   combining means for combining signals from said first and second signal paths onto a common signal path;
   means for applying said tuning signal to said filter means of said first and second signals paths; and
   means coupled to said first signal path and responsive to said band signal for modifying said tuning signal applied to said first and second resonant circuits by different amounts when said selected radio frequency signal is included in said second frequency band.

2. The tuning system of claim 1 wherein:
   said first and second resonant circuits respectively include first and second variable capacitance diodes to which said tuning signal is applied;
   said means for applying includes at least one resistance through which said tuning signal is applied to said first capacitance diode; and
   said means for modifying includes:
   first means connected to a circuit point between said resistance and said first capacitance diode for changing the potential thereat; and
   second means responsive to said band signal for changing the tuning signal applied to said second capacitance diode in a sense opposite to the sense of the change of the potential at said circuit point.

3. The tuning system of claim 2 wherein said means for changing the tuning signal applied to said second capacitance diode includes a diode and a resistance for coupling said band signal to said second capacitance diode.

4. The tuning system of claim 1 wherein:
   said first and second resonant circuits respectively include first and second variable capacitance diodes to which said tuning signal is applied;
   said means for applying includes a first resistance through which said tuning signal is applied to said first capacitance diode and a second resistance through which said tuning signal is applied to said first and second capacitance diodes;
   said means for modifying includes first means connected to a circuit point between said first resistance and said first capacitance diode for changing the potential thereat.

5. The tuning system of claim 2 or 4 wherein said first means for changing the potential includes switch means for selectively making a conductive connection to a source of potential in response to said band signal.

6. The tuning system of claim 5 wherein said switch means includes a transistor having an output electrode coupled to said circuit point, having a common electrode connected to said source of potential, and having an input electrode to which said band signal is applied for causing said transistor to be conductive between its output and common electrodes.

7. The tuning system of claim 1 further comprising:
   oscillator means for developing an oscillator signal having a frequency determined in response to said tuning signal;
   mixing means coupled to said common signal path for heterodyning said combined radio frequency signals thereon with said oscillator signal to develop a heterodyned signal; and
   said tuning control means controlling said tuning signal to determine the frequency of said oscillator signal so that said heterodyned signal has a predetermined frequency.

* * * * *